United States Patent [19]

Brotherton et al.

[11] Patent Number: 4,520,427
[45] Date of Patent: May 28, 1985

[54] ELECTRICAL CIRCUIT ASSEMBLIES

[75] Inventors: William A. Brotherton, Lothian; Kenneth Street, Dunfermline, both of Scotland

[73] Assignee: Ferranti plc, Cheadle, England

[21] Appl. No.: 379,768

[22] Filed: May 19, 1982

[30] Foreign Application Priority Data

May 29, 1981 [GB] United Kingdom ................. 8116470

[51] Int. Cl.³ .......................... H02B 1/00; H05K 7/20; H01R 13/00
[52] U.S. Cl. ............................... 361/389; 339/17 CF; 339/17 M; 339/112 R; 339/147 R; 361/394
[58] Field of Search ............ 339/17 N, 112 R, 147 R, 339/17 M, 17 CF; 361/386, 396, 412, 389, 393, 394, 395, 413, 414, 415

[56] References Cited

U.S. PATENT DOCUMENTS

| 2,774,014 | 12/1956 | Henry, Jr. ................... 339/17 N X |
| 3,209,208 | 9/1965 | Francis et al. ................ 361/386 X |
| 3,596,140 | 7/1971 | Walsh ........................ 339/17 M X |
| 3,942,854 | 3/1976 | Klein et al. ................ 339/112 R X |
| 3,999,105 | 12/1976 | Archey et al. ............. 339/17 CF X |

OTHER PUBLICATIONS

"New Wafer Modules . . . for Versatile Telemetering Systems", *Electronic Design*, Dec. 9, 1959, pp. 58–59.
L. F. Miller, "Stacked Wafer Package", *IBM Technical Disclosure Bulletin*, vol. 16, No. 2, Jul. 1973, p. 627.

*Primary Examiner*—Gil Weidenfeld
*Assistant Examiner*—Steven C. Bishop
*Attorney, Agent, or Firm*—Kerkam, Stowell, Kondracki & Clarke

[57] ABSTRACT

In an electrical circuit assembly a stack of modules is secured in a bore through a casing, there are longitudinally extending grooves in the internal surface of the casing, and electrical interconnections each have a part both extending from a module and protruding into a groove, and a part in the groove. The electrical interconnections, the constituent electrical interconnection parts, if initially separable, and possible insulating members in the grooves between some electrical interconnections, are secured, and required electrical connections are made, by these circuit assembly parts being clamped together in the grooves. The stack may be clamped in the bore. The clamping means may include end covers for the grooves and/or for the casing bore, and the end covers may be in resilient engagement with, respectively, the electrical interconnections, and/or the module stack.

16 Claims, 5 Drawing Figures

ELECTRICAL CIRCUIT ASSEMBLIES

This invention relates to electrical circuit assemblies, and in particular to electrical circuit assemblies each having a plurality of, possibly, at least substantially identically constructed, modules assembled into a stack, each such module possibly being at least substantially laminar in overall shape, and electrical interconnections are provided between the constituent modules of the stack to complete a required circuit.

It is an object of the present invention to provide such an electrical circuit assembly construction in which at least the electrical interconnections are located, and secured, in a novel and advantageous way.

According to the present invention an electrical circuit assembly comprises a stack of a plurality of modules, a housing at least including a hollow casing, a bore extending through the casing, a plurality of grooves provided in the internal surface of the hollow casing and extending longitudinally along the bore, electrical interconnections are provided to complete a circuit, each electrical interconnection having at least one part both extending from an associated module and protruding into an associated groove, and at least one part extending along the associated groove and at least partially residing therein, possibly protruding from the groove, the electrical interconnection parts extending from the modules extending in parallel plane, terminals mounted in the housing are provided for the electrical circuit assembly, at least the surface portions of the housing contiguous with the electrical interconnections and the terminals are of electrically insulating material, and the electrical circuit assembly also includes clamping means, the arrangement being such that the electrical interconnections are clamped within the grooves, and the stack of modules is secured within the casing bore, in any convenient way.

The constituent parts of the electrical output assembly are assembled by sliding the modules along the casing bore, and sliding at least the parts of the electrical interconnections at least partially residing in the grooves in the casing along the grooves, either separately, or together, possibly at least the parts of the electrical interconnections extending from the modules being assembled with the modules.

The securing of the stack of modules in the casing bore at least may be assisted by the module stack being at least a clost fit in the bore. With any such arrangement it is not essential that the module side walls adjacent to the internal surface of the hollow casing have a shape in plan identical with the cross-sectional shape of the casing bore, and the module side walls may be in close proximity to the internal surface of the hollow casing only at spaced regions thereof, for example, modules which are square shaped in plan being a close fit within a casing bore which is circular in cross-section.

Conveniently, the casing bore, and each module, are all circular in cross-section, with the electrical interconnections extending generally radially from each module.

At least some of the electrical interconnections each may be considered to be connected electrically to only one module of the stack, the electrical interconnections being connected electrically to one or two other electrical interconnections within the associated groove; and/or at least some of the electrical interconnections each may be considered to be connected electrically to two modules of the stack, possibly such an electrical interconnection not being connected electrically to another electrical interconnection, but including two parts, with each such part extending individually from one of the two modules connected together, and protruding into the associated groove.

When each, of at least some, of the electrical interconnections has a plurality of constituent, initially separable, parts electrically connected together, each initially separable electrical interconnection part extending from a module of the stack, and co-operating within the associated groove with electrical interconnection parts at least partially residing within the groove, may comprise a lead secured to the module. The stack of modules may be secured within the casing bore solely, or partially, in this way. The arrangement may be such that the associated module of the stack can have only one orientation within the bore of the hollow casing, ensuring the correct orientation of the module within the bore.

When, at least some of, the electrical interconnections each has a unitary form it may comprise a resilient member, secured to at least one associated module of the stack by resiliently engaging the associated module or modules.

The arrangement may be such that the constituent, initially separable, parts of each electrical interconnection having such constituent parts are electrically connected together; and/or adjacent electrical interconnections, of at least some electrical interconnections of the circuit assembly, of non-unitary or unitary forms, are electrically connected to each other; only within the grooves, by, respectively, the co-operating, initially separable, electrical interconnection parts, and/or the adjacent electrical interconnections, being clamped to be contiguous with each other. Thus, there is obviated the need to provide soldered bonds for any such electrical connection within the grooves.

Even when more than one form of electrical interconnection is provided in the electrical circuit assembly, each electrical interconnection may have a standard overall shape, or one of a plurality of standard overall shapes, although, possibly, different electrical interconnections extend by different amounts along the grooves, where appropriate, for example, where the spacings between adjacent modules within the stack differ, or non-adjacent modules are to be interconnected.

The constituent modules of the stack may have any convenient form, for example, comprising packaged thin film modules of a conventional construction.

Possibly, each module is at least substantially laminar in overall shape.

Conveniently, the constituent modules of the stack are constructed in an at least substantially identical manner. Thus, each constituent module of the stack may have a standard overall shape, or one of a plurality of standard overall shapes.

Thus, the term "standard overall shape" is employed herein to mean that at least one particular shape is defined which is common to a plurality of elements. There is at least one common overall shape to which the electrical connections conform, and at least one common overall shape to which the constituent modules conform.

Electrically insulating spacing members may be provided within the grooves, where otherwise adjacent electrical interconnections are not required to be connected electrically to each other, the electrically insulating spacing members being clamped within the grooves together with the provided electrical interconnections. Usually each electrically insulating spacing member has the shape, or one of the shapes, of the electrical interconnections, or of the parts of the electrical interconnections at least partially residing within the grooves, and can be replaced by an appropriately shaped electrical interconnection, or such an electrical interconnection part, or vice versa, where desired. It is unimportant whether the electrically insulating spacing members protrude beyond the grooves, or not. Hence, a versatile form of construction for the electrical circuit assembly is provided, a plurality of different possible circuits being capable of being provided by electrical circuit assemblies in accordance with the present invention, each such electrical circuit assembly having an at least substantially identical construction and the constituent parts of the electrical circuit assemblies having standard shapes.

When electrically insulating spacing members are provided within the grooves, at least some of the grooves provided within the casing may be intercommunicating grooves. Of each group of grooves which intercommunicate with each other, considered individually, possibly only one constituent groove is adjacent to the casing bore, the other constituent grooves only communicating with adjacent grooves of the group, and at least some of the electrical interconnection parts extending from the modules each also extend between, and protrude into, a plurality of associated intercommunicating grooves, and possibly protrude into all the intercommunicating grooves, of the associated group, this electrical interconnection part being electrically connected to, for example, by being clamped to be contiguous with the, or both, adjacent electrical interconnection parts in each of, one or more of, the associated intercommunicating grooves, and is clamped in each associated intercommunicating groove. Thus, there is provided an even more versatile form of construction for the electrical circuit assembly than that referred to above.

Conveniently, the parts of the electrical interconnections at least partially residing within the grooves, and the electrically insulating spacing members, if provided, are retained so that they can only slide along the longitudinally extending grooves, including intercommunicating grooves, if provided, during the assembling of the circuit assembly, by, when the cross-sections of the grooves and these retained circuit assembly parts are considered, the portions of the grooves closest to the casing bore being narrower in width than the portions of the grooves spaced further from the casing bore, and the retained parts of the electrical circuit assembly being at least a close fit within the grooves. For example, each longitudinally extending groove has a cross-section in the shape of the major part of a circle, and the retained parts of the electrical circuit assembly each has the cross-sectional shape of at least the major part of a circle, both circles being of substantially the same diameter. If the retained parts of the electrical interconnections are not integral with the co-operating electrical interconnection parts extending from the modules of the stack, they comprise discrete conductive members, possibly in the form of cylinders, circular in cross-section. Thus, the assembling of the parts of the electrical circuit assembly at least partially residing in the grooves is facilitated.

At least one spacing member of any convenient form may be provided within the module stack, each provided spacing member being between an otherwise adjacent pair of modules in the stack, or, possibly, is located at either extremity of the stack, and is considered to be part of the module stack. Different forms of spacing members may be provided within the stack. The spacing members at least partially may be secured to an adjacent module, or modules, and/or at least partially may be integral with an adjacent module. A composite spacing member, or spacing members, may be provided, for example, each such spacing member partially to comprise a heat sink, and/or a compressible or a resilient member, as referred to below. Such a composite spacing member may comprise both a heat sink, and a compressible or a resilient member. The constituent parts of a composite spacing member, of any form, may be only contiguous with each other, or may be secured together.

A compressible member, or members, may be included in the electrical circuit assembly, the clamping means provided for the electrical interconnections, and for the electrically insulating spacing members, if provided, acting also on each such compressible member. In addition, or alternatively, the clamping means is in resilient engagement with the circuit assembly parts at least partially residing within the grooves. With any such arrangement, the tolerances associated with the assembling of the constituent electrical circuit assembly parts at least partially residing within the grooves can be greater than otherwise would be the case. Each provided compressible member may comprise a resilient member, each resilient member comprising part of the clamping means for the electrical interconnections, and for the electrically insulating spacing members, if provided. Any electrically insulating spacing member provided within the grooves, conveniently, comprises a compressible member, and possibly comprises a resilient member. Also in addition, or alternatively, the clamping means at least includes end covers for the grooves, each end cover being arranged to engage, either directly or indirectly, the circuit assembly parts at least partially residing within the grooves, and the end covers comprising parts of the housing of the electrical circuit assembly. The end covers for the grooves may be resilient. Alternatively, the end covers for the grooves may be provided with resiliently mounted abutment pieces, considered to be parts of the end covers, and capable of entering the grooves to engage the adjacent circuit assembly parts at least partially residing therein. When end covers for the grooves are provided, they may be secured to the casing in any convenient manner, for example, by tie-bars, each tie-bar extending through the casing and being tightened against both co-operating end covers.

Irrespective of whether the stack of modules is secured within the casing bore by being secured to the electrical interconnections, and/or by being at least a close fit in the casing bore, the stack of modules may be secured in the casing bore in any other convenient way. Thus, clamping means may be arranged to act also on a compressible member, or members, each at least partially comprising a spacing member included in the module stack. In addition, or alternatively, the clamping means is in resilient engagement with the module stack. With any such arrangement the tolerances associated with the assembling of the module stack within the casing bore can be greater than otherwise would be the case. Also in addition, or alternatively, the arrangement may be such that the clamping means for the module stack at least includes end covers for the casing bore, each such end cover being arranged to engage, either directly, or indirectly, the module stack, and the end covers comprising parts of the housing of the electrical circuit assembly. The end covers for the casing bore may be resilient. When a compressible spacing member, or members, are included in the module stack, each compressible member may comprise a resilient member, each resilient member comprising part of the clamping means for the module stack. Conveniently, each compressible, or resilient, member is at least substantially of annular or laminar form, and, for example, each provided resilient member comprises a metal spring if there is to be a high ambient temperature within the electrical circuit assembly, or is a foam of a plastics material. When end covers for the casing bore are provided, they may be secured to the casing in any convenient manner, for example, by tie-bars, each tie-bar extending through the casing and being tightened against both end covers.

Common clamping means may be provided for the electrical interconnections, and for the electrically insulating spacing members, if provided, at least partially residing in the grooves, and for the module stack in the casing bore. For example, common end covers for the grooves and the casing bore may be provided, possibly, such common end covers each having a composite form of construction, with mechanically inter-engaging parts.

Common end covers for the grooves and the casing bore may be provided irrespective of whether they comprise at least part of the clamping means for the electrical circuit assembly parts at least partially residing in the grooves, and/or whether they comprise at least part of clamping means for the module stack. The common end covers may comprise closure members for the hollow casing. Such closure members may provide fluid-tight seals with the hollow casing, so that the ambience within the hollow casing is determined when assembling the constituent parts of the electrical circuit assembly; and/or there is prevented the inadvertent ingress of dirt, or any fluid, into the hollow casing, under normally encountered operating conditions for the electrical circuit assembly.

Terminals may be provided for the electrical circuit assembly in any convenient way. Because the terminals are to be electrically connected to the electrical interconnections associated with the stack of modules, conveniently, at least a part of each terminal is substantially identical with, and at least partially is secured within the electrical circuit assembly in the same way as, at least a part of an electrical interconnection. For example, each terminal has a part substantially identical with the part of an electrical interconnection extending from a constituent module of the stack, this terminal part protruding into a groove in the casing, where it is electrically connected to an adjacent electrical interconnection in the same way as the electrical interconnections are electrically connected, this terminal part is clamped in the groove together with the electrical interconnections, and extends in a plane parallel to each plane in which each substantially identical electrical interconnection part extends. If end covers, comprising part of the housing of the electrical circuit assembly, are provided for the grooves in the casing, and/or for the casing bore, conveniently, the terminals may be at least partially mounted within bores within the end covers.

A composite casing may be provided, comprising an outer, hollow member, into the bore of which outer member is inserted a preformed, inner, hollow member providing the longitudinally extending grooves. Such a casing construction facilitates the fabrication of a casing of the desired shape. The inner member may be secured to the outer member in any convenient way, for example, by the inner member being a press-fit in the bore of the outer member. The inner member may be initially of at least substantially planar form, and is deformed in the required manner in order to be inserted into the bore of the outer member. The inner member may be of sheet material, for example, the inner member being fabricated by folding in an appropriate way sheet stock material. When the inner member is of sheet material, longitudinally extending passages are provided between the inner member and the outer member of the composite casing, such passages being interspersed between the longitudinally extending grooves. The arrangement may be such that a coolant can be forced through the passages, to remove heat from within the electrical circuit assembly, the passages also extending through the end closure members, if provided.

Such passages may be provided for a coolant even if a composite casing is not provided, the passages at least including bores through a casing of unitary form.

Each of at least some initially separable parts of a composite housing, or the housing if comprising a casing of a unitary form, may be wholly of an electrically insulating material, such as a plastics material. If a composite casing construction as referred to in the preceding paragraph is provided, possibly, only the inner, groove-defining, member is of electrically insulating material, and the outer member is of metal. Alternatively, if at least the casing of the housing is of metal, except at least the surface portions thereof contiguous with the electrical interconnections, and possibly with the terminals, these surface portions may be provided with a layer of electrically insulating material on the metal in any convenient way. For example, if at least the casing of the housing is of an alloy of aluminium, at least the surface portions thereof contiguous with the electrical interconnections, and possibly with the terminals, are anodised, and possibly an additional layer of electrically insulating material is provided on the anodised surfaces.

When closure members are not provided for the hollow casing, and sufficiently wide spaces are left between the internal surface of the hollow casing and the modules, the arrangement may be such that a coolant can be passed through the casing bore, and over at least part of each constituent module of the stack.

When at least one spacing member is provided within the module stack, the spacing member, or each of at least some of the provided spacing members, may comprise, or include, a heat sink arranged to conduct heat away from the module, or modules, with which it is at least contiguous. If the casing is substantially of metal, each heat sink may be a close clearance fit within the casing bore, so that heat is capable of being transferred from the heat sink to the casing via the small gap therebetween. The heat may be removed from the casing in any convenient way, and the casing structure may be arranged to facilitate this, for example, by providing coolant passages therethrough as referred to above. In addition, or alternatively, when closure members are not provided for the hollow casing, the arrangement may be such that a coolant can be passed though the casing bore, and over at least part of each provided heat sink. Thus, sufficiently large spaces are required to be left between the internal surface of the hollow casing and the modules, and either sufficiently large spaces are left between the internal surface of the hollow casing and the spacing members at least including the heat sinks, or slots or apertures are provided in the spacing members at least including the heat sinks, to enable the coolant to pass through the casing bore.

The present invention will now be described by way of example with reference to the accompanying drawings, in which.

Figure 1:
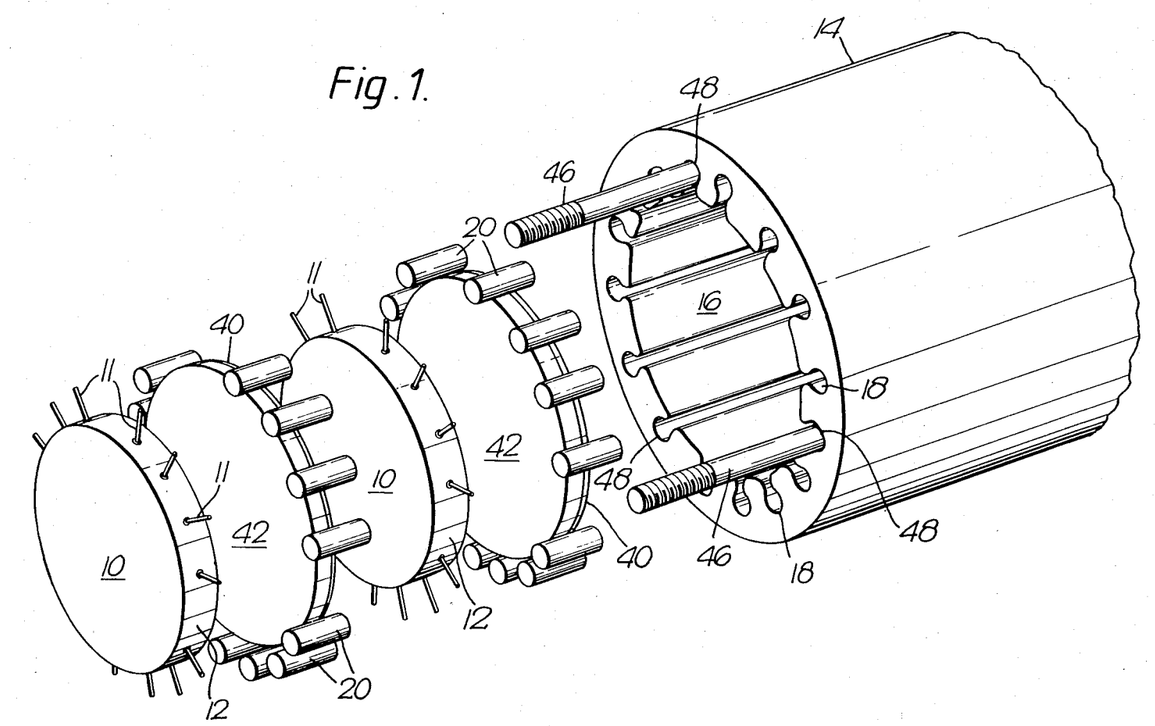
FIG. 1 is a perspective, exploded, view of part of one embodiment of an electrical circuit assembly in accordance with the present invention.
Figure 2:
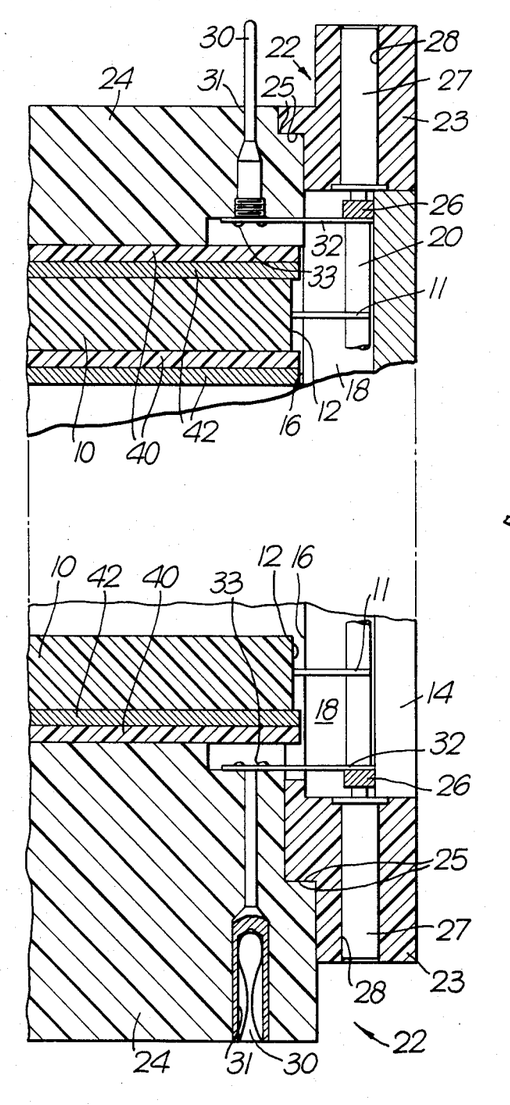
FIG. 2 is a sectional elevation of half of the completed electrical circuit assembly of FIG. 1.

The electrical circuit assembly shown in FIGS. 1 and 2 comprises a stack of a plurality of modules 10. Each constituent module 10 of the stack has an identical construction, for example, comprising a packaged thin film module of a conventional construction, and each module has an identical overall, laminar shape, and is circular in plan. Leads 11 extend radially from the circular side wall 12 of each module 10, each lead comprising a part of an electrical interconnection, the leads being secured to the modules. The electrical interconnections of the circuit assembly are provided between the constituent modules 10 of the stack, in the ways described below, to complete a required circuit.

The electrical circuit assembly also includes a housing, the housing including a cylindrically-shaped, hollow casing 14, of an alloy of aluminium, with a bore, circular in cross-section, extending therethrough. Thus, the hollow casing 14 has a cylindrically-shaped internal surface 16. Grooves 18 are formed in the internal surface 16 of the casing, and the grooves extend longitudinally along the bore.

The circular-in-plan modules are a loose fit within the circular-in-cross-section casing bore, the diameter of each module being less than the diameter of the casing bore by 0.05 to 0.08 centimeter, but the shape in plan of each module is considered to be identical with the cross-sectional shape of the casing bore.

Each module lead 11 protrudes into an associated groove 18, where it co-operates with a discrete, cylindrically-shaped, conductive member 20, comprising another part of the electrical interconnection including the lead, the conductive member partially residing within the associated groove, protruding beyond the groove, and the conductive member extending along the groove. Further, the conductive member 20 is retained so that it can only slide along the longitudinally extending groove 18 during the assembling of the circuit assembly, by being a close fit in the groove. Thus, the groove 18, and each conductive member 20, have a cross-sectional shape of at least the major parts of circles of substantially the same diameter. The assembling of the conductive members is facilitated in this way.

The constituent parts of the electrical circuit assembly are assembled by sliding the modules 10 along the casing bore, together with sliding the module leads 11 along the grooves 18 in the casing. After the insertion of a module into the casing bore, the conductive member 20, to co-operate with the module leads 11, are inserted into the grooves, and in this manner the electrical circuit assembly is built up. The arrangement is such that each constituent module of the stack can have only one orientation within the bore of the hollow casing, ensuring the correct orientation of the module within the bore, by the module leads, and the associated grooves, not being uniformly distributed, respectively, about the periphery of the module when considered in plane, and the internal surface 16 of the casing. For each module the leads extend in the same plane.

In relation to each groove, the module leads protruding therein are electrically connected to each other. Each constituent electrical interconnection of the circuit assembly, comprising a module lead 11 and a conductive member 20, is considered to be connected to only one module 10, and is electrically connected to the adjacent electrical interconnection, or both adjacent electrical interconnections, in the groove. The module leads 11 of the circuit assembly extend in parallel planes.

As shown in FIG. 2, closure members, included within the housing of the circuit assembly, and comprising composite end covers 22, of a plastics electrically insulating material, are provided for the hollow casing 14. Each composite closure member 22 has two mechanically inter-engaging parts, one part 23 comprising an annular-shaped end cover for the grooves in the casing, and the outer part 24 comprising a circular-shaped end cover for the casing bore. For each composite closure member 22, complementary shoulders 25 are provided on the two co-operating end covers 23 and 24, the two end covers being mechanically inter-engaged at these shoulders.

Resiliently mounted abutment pieces 26, considered to be part of each end cover 23 for the grooves, extend from each such end cover, the abutment pieces comprising spring loaded plungers extending from hollow cylinders 27, the hollow cylinders being mounted, by being a press fit, in bores 28 in the end covers. The arrangement is such that, with the end covers 23 secured in their appropriate positions on the casing, the resiliently mounted plungers 26 enter the grooves, and engage indirectly the electrical interconnection parts partially residing within the grooves. Hence, the electrical interconnection parts partially residing within the grooves are secured, by being clamped, within the grooves; the clamping means including the end covers for the grooves. The clamping action also ensures that the initially separable, co-operating constituent parts of the electrical interconnections, and adjacent electrical interconnections, are electrically connected to each other in each groove, by being clamped to be contiguous with each other.

Because there is resilient engagement between the clamping means, and the electrical interconnection parts partially residing within the grooves, the tolerances associated with the assembling of these electrical interconnection parts can be greater than otherwise would be the case.

Thus, there is obviated the need to provide soldered bonds for any such electrical connection within the grooves. Any electrical connection within the electrical circuit assembly which is not soldered is capable of being subjected to higher temperature than soldered electrical connections. Because the desired electrical connections in the grooves are formed by the co-operating electrical interconnection parts being clamped to be contiguous with each other, the electrical connections are easy to provide.

Also shown in FIG. 2 are terminals for the electrical circuit assembly, each terminal having a composite construction. Each terminal has a part 30 mounted in a bore 31 in an end cover 24 for the casing bore, and a part 32 extending from the part 30 mounted in an end cover to protrude into an associated groove of the casing. The two terminal parts are secured together at 33. The terminal parts 30 mounted in the end covers 24 comprise either plugs or sockets, and are to co-operate with conductive members, not comprising parts of the electrical circuit assembly, which co-operating members extend from the circuit assembly, and may comprise co-operating sockets or plugs of another electrical circuit assembly or assemblies of an identical construction.

Each terminal part 32, protruding into an associated groove, is substantially identical with a module lead, and is clamped in the associated groove in the same way as the module leads. Thus, the terminal part is electrically connected to the adjacent electrical interconnection in the associated groove by being clamped within the groove to be contiguous with the adjacent electrical interconnection part, in the same way as for the module leads. Further, each such terminal part extends in a plane parallel to each plane in which the module leads extend.

In the illustrated embodiment the resiliently mounted abutment pieces 26 engage the terminal parts 32 in the grooves, and not the electrical interconnection parts. Alternatively, the resiliently mounted abutment pieces engage the electrical interconnection parts directly, the terminals being secured to the electrical interconnections in any convenient way.

It is required that the surface portions of the aluminium alloy casing 14 contiguous with the electrical interconnections and the terminals are of electrically insulating material. Conveniently, these electrically insulating surface portions are obtained by anodising the surface portions of the aluminium alloy casing, and possibly by providing an additional electrically insulating layer on the anodised surfaces, for example, by varnishing these surfaces.

Spacing members are provided between each otherwise adjacent pair of modules in the stack, and at either extremity of the stack, and the spacing members are considered also to be included within the stack. In the illustrated embodiment each provided spacing member has a composite construction, comprising both a resilient member in the form of a sheet of foam 40, of a plastics material, and a metal heat sink 42, adhering to each other. The overall shape of the spacing member is that of a laminate, one major surface of the spacing member being provided by the foam 40, and the other major surface being provided by the heak sink 42. The spacing member 40, 42 is circular in plan, and has a diameter slightly larger than the diameter of each module of the stack, being a close clearance fit within the circular-in-section casing bore. Hence, heat can be transferred to the heat sink from the module contiguous with the heat sink, and heat can be transferred from the heat sink to the casing, across the small gap therebetween, for example, the clearance to the casing being 0.01 to 0.04 centimeter. The heat may be removed from the casing in any convenient way, and the casing structure may be arranged to facilitate this, for example, by providing fins (not shown) on the external surface of the hollow casing.

Because resilient members 40 are interspersed between the constituent modules 10 of the stack, the resilient members comprise part of clamping means for the module stack, together with the end covers 24 for the casing bore. The arrangement is such that, with the end covers 24 secured in their appropriate positions on the casing, the end covers engage directly the module stack, and the clamping means resiliently acts on the modules 10. Because there is resilient engagement between the clamping means and the module stack, the tolerances associated with the assembling of the module stack within the casing bore can be greater than otherwise would be the case.

Because the end covers 24 for the casing bore are mechanically inter-engaged with the end covers 23 for the grooves in the casing, the end covers for the grooves being part of clamping means for the circuit assembly parts at least partially residing in the grooves, common clamping means can be considered as being provided for the circuit assembly parts at least partially residing in the grooves, and for the module stack.

As shown in FIG. 1, the electrical circuit assembly, and in particular the common, clamping means of the circuit assembly, is completed by providing three tie-bars 46, in equi-spaced grooves 48 which extend longitudinally through the casing, and through bores in the end covers. For the sake of clarity only two tie-bars are illustrated. Each tie-bar 46 is tightened against both co-operating, composite, closure members 22, and so causes both the electrical interconnections to be clamped in the grooves, and the module stack to be clamped in the casing bore.

The closure members provide fluid tight seals with the hollow casing, so that the ambience within the hollow casing is determined when assembling the constituent parts of the electrical circuit assembly; and/or there is prevented the inadvertent ingress of dirt, or any fluid, into the hollow casing, under normally encountered operating conditions for the electrical circuit assembly.

Figure 3:
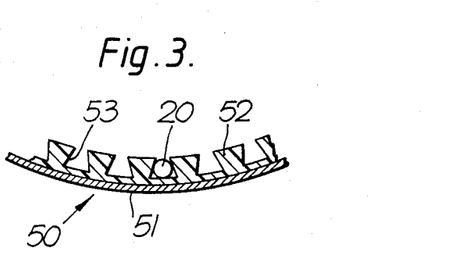
FIG. 3 is a section of part of a modified construction for a casing of the electrical circuit assembly.

A modified form of casing 50 for the electrical circuit assembly of FIGS. 1 and 2 is shown partially in FIG. 3. This casing 50 has a composite construction comprising an outer, hollow member 51, of metal, into the bore of which outer member is inserted a preformed inner, hollow member 52, of electrically insulating material, and providing the longitudinally extending grooves 53. The inner member 52 is secured to the outer member 51 in any convenient way, for example, by the inner member being a press fit in the bore of the outer member. The inner member 52 is initially of at least substantially planar form, and is deformed in the required manner in order to be inserted into the bore of the outer member 51. The inner member, by being fabricated when at least substantially planar in form, facilitates the provision of the required casing construction. Each groove 53 has a cross-sectional shape comprising a truncated triangle.

The inner member may be of metal, and so the surface portions, otherwise contiguous with the electrical interconnections and the terminals, are required to be coated with electrically insulating material.

In an unillustrated modification of the composite casing construction of FIG. 3, the inner member is of sheet material. Thus, longitudinally extending passages are provided between the inner member and the outer member of the composite casing, such passages being interspersed between the longitudinally extending grooves. Such an inner member may be moulded from a plastic material; or may be formed from any convenient sheet stock material, by folding the material in the appropriate way.

Passages, through which a coolant can be forced to remove heat from within the electrical circuit assembly, may be provided within the casing in the manner referred to in the preceding paragraph for a composite casing, or by providing bores through a casing of unitary form. The passages are arranged to extend also through the closure members for the hollow casing. Possibly the arrangement is such that the coolant cannot enter the casing bore containing the module stack.

Figure 4:
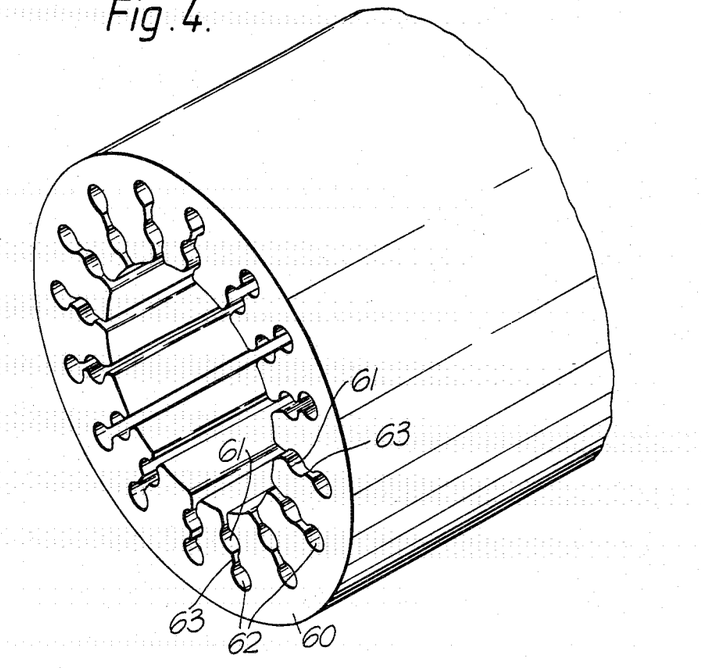
FIG. 4 is a perspective view of the casing for a modified form of electrical circuit assembly.
Figure 5:
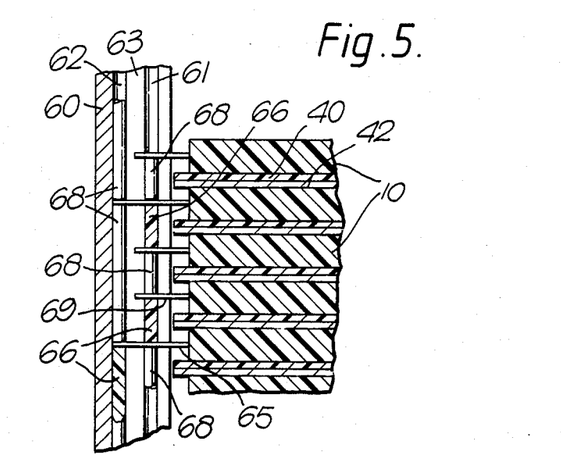
FIG. 5 is a sectional elevation of part of the modified electrical circuit assembly including the casing of FIG. 4.

Another modified form of casing is shown at 60 in FIGS. 4 and 5. In the casing 60 are provided longitudinally extending, intercommunicating pairs of grooves. Of each pair of intercommunicating grooves, only one constituent groove 61 is adjacent to the casing bore, and the other groove 62 communicates with this groove 61. Each pair of intercommunicating grooves 61, 62 are radially spaced in relation to the longitudinal axis of symmetry of the cylindrically-shaped casing 60. Each groove 61 and 62 has the cross-sectional shape comprising the major part of a circle, with a narrow intercommunicating portion 63 between the constituent grooves of each pair, and a further, narrow portion between the casing bore and the adjacent groove of the pair. Some of the electrical interconnection parts 65 extending from the modules 10, in addition to protruding into an associated groove 61 adjacent to the casing bore, also extend through this groove, and protrude into the groove 62 communicating with this groove, as shown in FIG. 5. Where otherwise adjacent electrical interconnections are not required to be connected electrically to each other, electrically insulating spacing members 66 are provided within the grooves. Each electrical interconnection part 65 can be electrically connected to the, or both, adjacent electrical interconnection parts 68, in one, or both of, the associated intercommunicating grooves. The remainder of the electrical interconnection parts 69 extending from the modules only extend into the associated groove 61 adjacent to the casing bore. The electrical interconnection parts 65, 68 and 69, and the electrically insulating spacing members 66, are clamped in the grooves 61 and 62. Different electrical interconnections extend by different amounts along the grooves, where appropriate, for example, where the spacings between adjacent modules within the stack differ, or non-adjacent modules are to be interconnected, or because electrical interconnection parts extending from the module do not protrude into both corresponding intercommunicating grooves. Each provided electrically insulating spacing member 66 has the shape, or one of the shapes, of the electrical interconnections, or of the parts 68 of the electrical interconnections at least partially residing within the grooves, and can be replaced by an appropriately shaped electrical interconnection, or such an electrical interconnection part, or vice versa, where desired.

Otherwise the construction of the electrical circuit assembly of FIGS. 4 and 5 is substantially identical with the construction of the electrical circuit assembly of FIGS. 1 and 2.

Hence, a versatile form of construction for the electrical circuit assembly is provided, a plurality of different possible circuits being capable of being provided by electrical circuit assemblies in accordance with the present invention, each such electrical circuit assembly having an at least substantially identical construction, and the constituent parts of the electrical circuit assemblies having standard shapes.

The electrical circuit assembly may be modified in various ways.

The constituent modules of the stack may not be identical in overall shape, although conveniently they are at least substantially identically constructed. Further, it is not essential that their overall shape is that of a lamina.

It is not essential that the module walls adjacent to the internal surface of the hollow casing have a shape in plan identical with the cross-sectional shape of the casing bore, for example, each module being square shape in plan when the casing bore is circular in cross-section.

More than one form of construction of module may be provided within the electrical circuit assembly.

Even when more than one form of module is provided, each module may have a standard overall shape, or one of a plurality of standard overall shapes.

The securing of the stack of modules in the casing bore may be assisted by the module stack being a close fit in the bore, for example, there being a clearance to the casing of 0.01 to 0.04 centimeter. With any such arrangement it is not essential that the module side walls adjacent to the internal surface of the hollow casing have a shape in plan identical with the cross-sectional shape of the casing bore, and the module side walls may be in close proximity to the internal surface of the hollow casing only at spaced regions thereof.

Irrespective of whether the module stack is at least a close fit within the casing bore, or not, the arrangement of the circuit assembly may be such that the module stack is not clamped within the casing bore, the module stack being secured in any convenient way. For example, the module stack at least partially may be secured by the constituent modules being secured to the electrical interconnections, which electrical interconnections are clamped within the grooves in the casing.

When clamping means is provided it may have any convenient form, and it may be in resilient engagement with the module stack, at least partially, by the provided end covers being resilient. The clamping means may have any convenient form; and may not include end covers for the casing bore; and/or may not include a resilient spacing member, or members. The clamping means may engage the module stack indirectly.

The parts of the electrical interconnections extending from the modules may be secured to the modules in any convenient way. When the module stack is clamped in the casing bore, these electrical interconnection parts may be secured to the modules, and are electrically connected to terminals of the modules, by being clamped, to be contiguous with the module terminals, within the module stack. These electrical interconnection parts may be located within the assembly either before or after the associated modules are located within the assembly.

It is not essential that the same number of electrical interconnections are connected to each constituent module of the stack. Further, it is not required that all the electrical interconnection parts extending from a module extend in the same plane, although usually they extend in the same plane or parallel planes.

The conductive members provided in the grooves may not protrude beyond the grooves.

At least some electrical interconnections each may have two parts at least partially residing in the groove.

The initially separable parts of the electrical interconnections may be secured together otherwise than by being clamped to be contiguous with each other within the associated groove.

At least some of the electrical interconnections each may not comprise initially separable parts, but instead has a unitary form, although each such electrical interconnection can be considered to have a part extending from a module and protruding into an associated groove, and a part at least partially residing within the groove and extending along the groove. Such unitary electrical interconnections may be located within the assembly either before or after the associated modules are located within the assembly, or the electrical interconnections and the associated modules may be assembled together.

Further, at least some of the electrical interconnections of the circuit assembly each may be considered to be connected electrically to two modules of the stack, and at least have two parts, with each such part extending individually from one of the two modules connected together, and protruding into the associated groove. Possibly such an electrical interconnection is not connected electrically to another electrical interconnection.

An electrical interconnection having a unitary form may comprise a resilient member, secured to at least one associated module of the stack by resiliently engaging the associated module or modules.

More than one form of electrical interconnection may be provided within the electrical circuit assembly.

Even when more than one form of electrical interconnection is provided in the electrical circuit assembly, each electrical interconnection may have a standard overall shape, or one of a plurality of standard overall shapes.

Adjacent electrical interconnections within a groove may be electrically connected to each other otherwise than by being clamped to be contiguous with each other within the associated groove.

Electrically insulating spacing members may be provided within the grooves, where otherwise adjacent electrical interconnections are not required to be connected electrically to each other, in any form of electrical circuit assembly in accordance with the present invention, and the electrically insulating spacing members may have any convenient cross-sectional shape. It is unimportant whether the electrically insulating spacing members protrude beyond the grooves, or not. When electrically insulating spacing members are provided, a versatile form of construction is obtained, a plurality of different possible circuits being capable of being provided by electrical circuit assemblies in accordance with the present invention, each such electrical circuit assembly having an at least substantially identical construction, and the constituent parts of the electrical circuit assemblies having standard shapes.

The grooves in the casing, including intercommunicating grooves, if provided, may have any convenient cross-sectional shape.

The parts of the electrical interconnections, and the electrically insulating spacing members, if provided, and at least partially residing in the grooves, may have any convenient cross-sectional shape when these circuit assembly parts are to be retained, so that they can only slide along the longitudinally extending grooves, during the assembling of the circuit assembly. However, it is required that, when the cross-sections of the grooves and the retained circuit assembly parts are considered, the portions of the grooves closest to the casing bore are narrower in width than the portions of the grooves spaced further from the casing bore, and the retained electrical circuit assembly parts are at least a close fit within the grooves.

It is not essential that the cross-sectional shape of each groove, including intercommunicating grooves, if provided, is such that the circuit assembly parts at least partially residing within the groove are retained so that they can only slide along the longitudinally extending groove during the assembling of the circuit assembly.

When intercommunicating grooves are provided within the casing, at least some of the groups of intercommunicating grooves, each may have more than two intercommunicating grooves, arranged in any convenient way, possibly with only one constituent groove adjacent to the casing bore, and the other constituent grooves only communicating with adjacent grooves of the group. With any such arrangement, at least some of the electrical interconnection parts extending from the modules protrude into, and are clamped within, a plurality of associated intercommunicating grooves, although possibly not all the intercommunicating grooves, of a group. In addition, intercommunicating grooves may be provided in the same casing with grooves which do not communicate with any other groove.

A compressible member, or members, may be included in the electrical circuit assembly, the clamping means provided for the electrical interconnections, and for the electrically insulating spacing members, if provided, acting also on each such compressible member. Each provided compressible member may comprise a resilient member, comprising part of the clamping means. Any electrically insulating spacing member provided within the grooves may comprise such a compressible, or a resilient, member.

The clamping means may be in resilient engagement with the circuit assembly parts at least partially residing within the grooves, in ways other than those referred to above. Thus, the end covers for the grooves may be resilient.

The clamping means for the circuit assembly parts at least partially residing within the grooves may have any convenient form, and may not include end covers for the grooves.

Different forms of spacing members may be provided within the stack, and/or spacing members of different overall shapes may be provided.

A composite spacing member instead of comprising a resilient member and a heat sink, may comprise a rigid member, and either a resilient member or a heat sink. The constituent parts of a composite spacing member may be only contiguous with each other.

At least some of the spacing members provided within the module stack each may solely comprise a rigid member, or a resilient member, or a heat sink.

At least some of the spacing members each, at least partially, either may be secured to, or may be integral with, an adjacent module, or modules.

If the temperature within the electrical circuit assembly, under normally encountered operating conditions, is high, a resilient member may comprise a metal spring, which may be annular in shape. A resilient member is only provided when the module stack is clamped within the casing bore, and the resilient member is acted upon by the clamping means. Only one spacing member, at least partially, comprising a resilient member, may be provided within the stack. Instead of providing a resilient member, a spacing member may at least partially comprise a non-resilient compressible member, to be acted upon by the clamping means for the module stack, although it cannot be considered to be part of the clamping means.

Spacing members may not be included in the module stack.

When clamping means is provided for the electrical circuit assembly parts at least partially residing in the grooves, and for the module stack in the casing bore, common clamping means may not be provided.

The closure members for the hollow casing may be secured to the casing in any convenient way, irrespective of whether they comprise part of the clamping means, or not, The closure members may not provide fluid-tight seals with the hollow casing.

Composite end covers may not be provided for the grooves and the casing bore, but instead either separate end covers, or common end covers, are provided. The end covers may not comprise closure members for the hollow casing.

End covers may not be provided for the grooves and/or for the casing bore.

When closure members are not provided for the hollow casing, and sufficiently large spaces are left between the internal surface of the hollow casing and at least the modules, the arrangement may be such that a coolant can be passed through the casing bore. When heat sinks are provided within the module stack, the coolant passes over at least part of each heat sink, to remove heat therefrom. Sufficiently large spaces are required to be left between the spacing members at least including the heat sinks and the internal surface of the hollow casing, or slots or apertures are provided in the spacing members at least including the heat sinks, to enable the coolant to pass through the casing bore. If heat sinks are not provided within the module stack, the coolant is required to pass over at least part of each module, to remove heat therefrom, and any spacing member provided within the module stack is required to be arranged to allow the coolant to pass through the casing bore.

Terminals may be provided for the electrical circuit assembly in any convenient way. Each terminal may have a part substantially identical with an electrical interconnection part at least partially residing in a groove.

When end covers are provided for the grooves, and/or for the casing bore, the end covers may be of metal, such as an alloy of aluminium, and the surface portions contiguous with the terminal parts are anodised.

Any metal part of a housing of the electrical circuit assembly of a composite construction may be provided, in any convenient way, with a layer of electrically insulating material on the surface portions otherwise contiguous with the electrical interconnections and the terminals, instead of anodising these surface portions, or when the metal is not suitable to be anodised.

Alternatively, the casing may be wholly of electrically insulating material.

Any such electrical circuit assembly construction referred to above, is compact. Further, the electrical circuit assembly is robust, the modules and the electrical interconnections being securely mounted within the electrical circuit assembly; and these circuit assembly parts are provided within a casing; so that they are not likely to be damaged either by vibration, or mechanical shock. In addition, the locating of the constituent modules and the electrical interconnections in their required positions within the electrical circuit assembly is facilitated. The arrangement may be such that it is easy to replace faulty modules, and possibly no handling damage is likely whilst such a replacement is being made. The electrical resistances associated with the electrical interconnections can be small.

What we claim is:

1. An electrical circuit assembly comprising:
   a housing including a hollow casing, and a bore extending through the casing;
   a plurality of grooves provided in the internal surface of the hollow casing and extending longitudinally along the bore;
   a stack of a plurality of modules secured within the casing bore, the modules having electrical connection leads extending in parallel planes from the modules into the grooves;
   separate interconnection parts extending longitudinally along the grooves and at least partially residing in the grooves, at least some of the separate interconnection parts being electrically conductive;
   the modules with connection leads and the separate interconnection parts being assembled in alternating fashion such that, within the grooves, there is a separate interconnection part on each side of at least those module connection leads which extend from intermediate modules of the stack; and
   clamping means for developing longitudinal clamping force along the grooves for clamping the module leads and the separate interconnection parts together within the grooves, the module leads and the electrically conductive separate interconnection parts, when clamped, together comprising electrical interconnections.

2. A circuit assembly as claimed in claim 1 in which each electrical interconnection is of a common overall shape.

3. A circuit assembly as claimed in claim 1 in which each constituent module of the stack is of a common overall shape.

4. A circuit assembly as claimed in claim 1 in which at least some of the separate interconnection parts extending longitudinally along the grooves are electrically insulating spacing members and are provided where otherwise adjacent module connection leads are not required to be electrically connected to each other, the electrically insulating spacing members being clamped within the grooves together with those interconnection parts which are electrically conductive.

5. A circuit assembly as claimed in claim 1 in which the separate interconnection parts at least partially residing within the grooves are retained, so that they can only slide along the longitudinally-extending grooves, during the assembling of the circuit assembly, by, when the the cross-sections of the grooves and these retained separate interconnection parts are considered, the portions of the grooves closest to the casing bore being narrower in width than the portions of the grooves spaced further from the casing bore, and the retained separate interconnection parts being at least a close fit within the grooves.

6. A circuit assembly as claimed in claim 5 in which each longitudinally extending groove has a cross-section in the shape of the major part of a circle, and each of the retained separate interconnection parts has the cross-sectional shape of at least the major part of a circle, both circles being of substantially the same size.

7. A circuit assembly as claimed in claim 1 in which the clamping means is in resilient engagement with the separate interconnection parts.

8. A circuit assembly as claimed in claim 1 in which the clamping means includes end covers for the grooves, each end cover being arranged to engage the separate interconnection, and the end covers comprising parts of the housing of the electrical circuit assembly.

9. A circuit assembly as claimed in claim 8 in which the clamping means is in resilient engagement with the separate interconnection parts, and the end covers for the grooves are provided with resiliently mounted abutment pieces, considered to be parts of the end covers, and capable of entering the grooves to engage the adjacent separate interconnection parts.

10. A circuit assembly as claimed in claim 1 in which end covers for the grooves and the casing bore are included in the housing of the electrical circuit assembly, the end covers comprising closure members of the hollow casing, and the closure members provide fluid-tight seals with the hollow casing.

11. A circuit assembly as claimed in claim 1 having a composite casing, comprising an outer, hollow member, into the bore of which outer member is inserted a preformed, inner, hollow member providing the longitudinally extending grooves, and in which the inner member of the composite casing is of electrically insulating material, and the outer member is of metal, and in which the inner member initially is of at least substantially planar form, and is deformable in the required manner in order to be inserted into the bore of the outer member.

12. A circuit assembly as claimed in claim 1 having at least one spacing member provided within the module stack, the spacing member at least including a heat sink arranged to conduct heat away from the modules with which it is contiguous.

13. A circuit assembly as claimed in claim 12 in which at least one composite spacing member is provided.

14. A circuit assembly as claimed in claim 12, in which the casing is substantially of metal, and each heat sink is a close clearance fit within the casing bore, so that heat is capable of being transferred from the heat sink to the casing, via the gap therebetween.

15. An electrical circuit assembly comprising a stack of a plurality of modules, a housing at least including a hollow casing, a bore extending through the casing, a plurality of grooves provided in the internal surface of the hollow casing and extending longitudinally along the bore, electrical interconnections being provided to complete a circuit, and the electrical circuit assembly also including clamping means, each of the electrical interconnections has a plurality of constituent, initially separable, parts electrically connected together, including one part comprising a lead secured to a module and both extending from the associated module and protruding into an associated groove, and at least one part extending along the associated groove and at least partially residing therein, the constituent, initially separable, parts of each such electrical interconnection being electrically connected together only within the grooves, by the co-operating interconnection parts being clamped to be contiguous with each other, and electrically insulating spacing members are provided within the grooves, where otherwise adjacent electrical interconnections are not required to be electrically connected to each other, the electrically insulating spacing members being clamped within the grooves together with the provided electrical interconnections, the electrical interconnection parts extending from the modules extending in parallel planes, terminals mounted in the housing are provided for the electrical circuit assembly, at least the surface portions of the housing contiguous with the electrical interconnections and the terminals being of electrically insulating material, the arrangement being such that the stack of modules is secured within the casing bore, and having at least some of the grooves provided within the casing comprising intercommunicating grooves, at least some of the electrical interconnection parts extending from the modules each also extend between, and protrude into, a plurality of associated intercommunicating grooves, this electrical interconnection part being electrically connected to the adjacent electrical interconnection parts in at least one of the associated intercommunicating grooves, and is clamped in each associated intercommunicating groove.

16. A circuit assembly as claimed in claim 15 in which the parts at least partially residing within the grooves are retained, so that they can only slide along the longitudinally-extending grooves, during the assembling of the circuit assembly, by, when the cross-sections of the grooves and these retained circuit assembly parts are considered, the portions of the grooves closest to the casing bore being narrower in width than the portions of the grooves spaced further from the casing bore, and the retained parts of the electrical circuit assembly being at least a close fit within the grooves.

* * * * *